(12) United States Patent
Su et al.

(10) Patent No.: US 8,430,690 B2
(45) Date of Patent: Apr. 30, 2013

(54) USB APPLICATION DEVICE AND METHOD FOR ASSEMBLING USB APPLICATION DEVICE

(75) Inventors: Chun-Nan Su, Taipei (TW); Chun-Ching Peng, Taipei (TW)

(73) Assignee: Primax Electronics, Ltd., Taipei (TW)

( * ) Notice: Subject to any disclaimer, the term of this patent is extended or adjusted under 35 U.S.C. 154(b) by 0 days.

(21) Appl. No.: 13/365,004

(22) Filed: Feb. 2, 2012

(65) Prior Publication Data

US 2013/0065450 A1  Mar. 14, 2013

(30) Foreign Application Priority Data

Sep. 9, 2011 (TW) .............................. 100132567 A

(51) Int. Cl.
*H01R 13/65802* (2006.01)
(52) U.S. Cl.
USPC .................................................... 439/607.01
(58) Field of Classification Search ............. 439/607.01, 439/607.09, 607.11, 607.32, 660
See application file for complete search history.

(56) References Cited

U.S. PATENT DOCUMENTS

| 2012/0040567 A1* | 2/2012 | Ho | 439/660 |
| 2012/0071032 A1* | 3/2012 | Tsai | 439/660 |
| 2012/0077390 A1* | 3/2012 | Tsai | 439/660 |

\* cited by examiner

*Primary Examiner* — Tulsidas C Patel
*Assistant Examiner* — Phuongchi T Nguyen
(74) *Attorney, Agent, or Firm* — Kirton McConkie; Evan R. Witt

(57) ABSTRACT

The present invention discloses a USB application device including a body, a circuit board, a plurality of first electrical pins and a plurality of electrical elements. The circuit board is disposed in the body. The plurality of first electrical pins are disposed on the circuit board and expended to the body such that the plurality of first electrical pins are partly exposed to the body. A space is formed between the plurality of first electrical pins and circuit board such that the plurality of electrical elements can be disposed on the space. The length of the circuit board therefore becomes shorter, and the volume of the USB application device is reduced.

26 Claims, 12 Drawing Sheets

USB APPLICATION DEVICE AND METHOD FOR ASSEMBLING USB APPLICATION DEVICE

FIELD OF THE INVENTION

The present invention generally relates to a transmission interface device, and more particularly to a universal serial bus (USB) application device.

BACKGROUND OF THE INVENTION

Since a USB transmission interface provides some advantages such as convenience, expandability and high transmission speed in use to users, it is popularly applied to various computer peripherals, information appliances (IAs) or 3C consumer electronics (computer, communications and consumer-electronics). Therefore, the USB transmission interface has become an indispensable transmission interface tool in work and family life to people today. Accordingly, a USB device having the USB transmission interface is popularly applied to storage or memory devices (such as flash devices, MP3 players) and receivers as well.

As described above, the receivers are used for receiving signals sent by a wireless device such as a wireless mouse. In a word, a receiver usually connects with a computer by using a USB transmission interface. In contrary, the wireless mouse is disposed with a transmitter therein. Therefore, commands of the wireless mouse operated by a user are capable of being sent to the receiver of the computer with a form of wireless signal, and then further transmitted to the computer to be read. And thus, the wireless mouse is able to be operated.

The structure of a USB device is exemplarily illustrated hereinafter by a traditional receiver. FIG. 1 illustrates an external structural view of a conventional receiver, FIG. 2 illustrates an internal structural view of a conventional receiver, and FIG. 3 illustrates a structural view of a connecting socket of a conventional receiver. Referring to FIG. 1 and FIG. 2 together first, the conventional receiver 1 comprises a circuit board 10, a body 11 and a metal case 12. The body 11 has a carrying plate 111, the circuit board 10 is disposed within the body 11 and a front end 101 of the circuit board 10 is exposed outside the body 11, and the front end 101 of the circuit board 10 is disposed on the carrying plate 111. The front end 101 of the circuit board 10 is disposed with a plurality of electrical pins 1011, 1012, 1013 and 1014, and the electrical pins 1011, 1012, 1013 and 1014 are respectively a VCC power source circuit, a GND power source circuit, a D+ data transmission circuit and a D− data transmission circuit, wherein the D+ data transmission circuit and the D− data transmission circuit are used for data transmission, while the VCC power source circuit and the GND power source circuit are used for receiving an operating circuit provided by a female connecting socket 2 (as illustrated in FIG. 3) or a power supply.

The metal case 12 encloses the front end 101 of the circuit board 10 in a manner of surrounding, so as to protect the circuit board 10. In addition, an inserting space 112 is formed between the front end 101 of the circuit board 10 and the metal 12, and thus the plurality of electrical pins 1011, 1012, 1013 and 1014 are exposed to the inserting space 112. The inserting space 112 is used for providing a space for fitting the conventional receiver 1 into the female connecting socket 2. In addition, the plurality of electrical pins 1011, 1012, 1013 and 1014 connect with a plurality of connecting pins 21 of the female connecting socket 2 as illustrated in FIG. 3.

As illustrated in FIG. 2, the circuit board 10 disposed within the body 11 further comprises a control circuit 102 and a memory unit 103. The memory unit 103 is used for storing data. Two ends of the control circuit 102 respectively connect with the memory unit 103 and the plurality of electrical pins 1011, 1012, 1013 and 1014 as a control device for transmitting or storing data there-between.

A portion of the body 11 of the conventional receiver 1 except the metal case 12 is defined as a holding portion, and users are capable of holding the conventional receiver 1 via the holding portion. As illustrated in FIG. 1, a length of the holding portion of the conventional receiver 1 is L1, and the length of the holding portion depends on an arrangement of various electrical elements disposed on the circuit board 10 inside the body 11. In general, the conventional receiver 1 is received within the wireless mouse, and the holding portion of the conventional receiver 1 has a certain length, and thus the wireless mouse must have a certain volume for receiving the conventional receiver 1. Therefore, it is unable to meet the requirement of users about the minimization of the wireless mouse in volume. Except for the receiver, it is important to users about the minimization of the USB devices applied to other fields as well. Accordingly, it is desired to provide a USB application device with a smaller volume.

SUMMARY OF THE INVENTION

The present invention is directed to a USB application device with a smaller volume.

The present invention is further directed to a simpler assembling method of a USB application device.

In a preferred embodiment, the present invention provides a USB application device capable of fitting into a female connecting socket, wherein the female connecting socket comprises a plurality of connecting pins, and the USB application device comprises:

a body;

a circuit board, disposed within the body;

a plurality of first electrical pins, a first end of each of the first electrical pins connecting with the circuit board, passing over a first surface of the circuit board and stereoscopically extending toward a top of the body, and thus each of the first electrical pins partly exposed by the body and contacting with each of the connecting pins of the female connecting socket, wherein a space is formed between each of the first electrical pins and the circuit board; and a plurality of electrical elements, disposed to the first surface of the circuit board.

In a preferred embodiment, the USB application device of the present invention further comprises a case fitting onto the body, so as to form an inserting space between the case and the body.

In a preferred embodiment, at least an electrical element of the plurality of electrical elements is disposed within the space formed between each of the first electrical pins and the circuit board.

In a preferred embodiment, the body comprises:

a body opening, disposed on a bottom of the body, and thus a second surface of the circuit board exposed by the body opening; and a carrying portion, formed by extending from the body toward a front end of the body, wherein the carrying portion has a plurality of apertures, each of the apertures corresponds to one of the first electrical pins, and each of the first electrical pins is partly exposed by each of the apertures.

In a preferred embodiment, the body further comprises a hook portion disposed to a front end of the carrying portion for supporting the circuit board, and the hook portion has an incline for guiding the circuit board to insert into the body.

In a preferred embodiment, the body comprises a body opening, a first end of the circuit board is exposed by the body opening, a second end of the circuit board passes through the body opening and inserts into the body, and an opening height of the body opening is smaller than a body height of the body.

In a preferred embodiment, at least one of the first end and a second end of each of the first electrical pins is mounted on the first surface of the circuit board by surface mounted technology (SMT) or soldering technology.

In a preferred embodiment, the circuit board comprises a plurality of circuit board apertures, each of the circuit board apertures corresponds each of the first electrical pins, and at least one of the first end and a second end of each of the first electrical pins passes through the corresponding one of the circuit board apertures, so as to connect with the circuit board.

In a preferred embodiment, a second end of each of the first electrical pins contacts with an inner surface of the body.

In a preferred embodiment, each of the first electrical pins comprises a fixing segment, an extending segment and a contacting segment, the fixing segment is the first end of each of the first electrical pins, the extending segment is located between the first surface of the circuit board and the body, a first surface of the contacting segment is exposed by the body, the first surface of the contacting segment is used for contacting with the connecting pins, and a bending structure is formed between the extending segment and the contacting segment.

In a preferred embodiment, the circuit board comprises a plurality of extending wire, and each of the extending wires corresponds to one of the first electrical pins, each of the fixing segments connects with the circuit board and is adjacent to a front end of the circuit board, each of the extending wires connects with the corresponding one of the fixing segments and extends toward a rear end of the circuit board, and the extending wire is directly formed on the circuit board.

In a preferred embodiment, at least an electrical element of the plurality of electrical elements is exposed within the space formed between a second surface of the contacting segment and the circuit board.

In a preferred embodiment, the contacting segment is a second end of the first electrical pins, and the contacting segment is exposed by the body without contacting with the body.

In a preferred embodiment, each of the first electrical pins comprises a first fixing segment, a second fixing segment, a first extending segment, a second extending segment, and a contacting segment, the first fixing segment is the first end of each of the first electrical pins, the second fixing segment is a second end of each of the first electrical pins, the first extending segment and the second extending segment are located between the first surface of the circuit board and the body, a first surface of the contacting segment is exposed by the body, the first surface of the contacting segment is used for contacting with the connecting pins, a bending structure is formed between the first extending segment and the contacting segment, and another bending structure is formed between the second extending segment and the contacting segment.

In a preferred embodiment, the circuit board comprises a plurality of extending wires, each of the extending wires corresponds to one of the first electrical pins, both of each of the first fixing segments and each of the second fixing segments connect with the circuit board and are adjacent to a front end of the circuit board, each of the extending wires connects with at least one of the corresponding one of the first fixing segments and the corresponding one of the second fixing segments and extends toward a rear end of the circuit board, and the extending wire is directly formed on the circuit board.

In a preferred embodiment, at least an electrical element of the plurality of electrical elements is exposed within the space formed between a second surface of the contacting segment and the circuit board.

In a preferred embodiment, the USB application device of the present invention further comprises a plurality of second electrical pins disposed on the first surface of the circuit board for contacting with a plurality of another connecting pins of the female connecting socket, wherein the plurality of first electrical pins form as a USB 2.0 transmission interface, while the plurality of first electrical pins and the plurality of second electrical pins form as a USB 3.0 transmission interface together.

In a preferred embodiment, the USB application device of the present invention further comprises a plurality of third electrical pins disposed on a second surface of the circuit board for contacting with the plurality of connecting pins of the female connecting socket, wherein the plurality of third electrical pins form as another USB 2.0 transmission interface, and thus both side of the USB application device are able to be plugged in.

In a preferred embodiment, the present invention further provides a USB application device comprising:
 a body;
 a circuit board, disposed within the body;
 a plurality of first electrical pins, disposed to the circuit board and adjacent to a front end of the circuit board, and each of the first electrical pins having a contacting segment used as a male plug contacting portion and formed from stereoscopically extending, wherein a first surface of each of the contacting segment is exposed by the body, and a space is formed between a second surface of each of the contacting segment opposite to the first surface and a first surface of the circuit board; and
 a plurality of electrical elements, disposed to the circuit board, wherein at least an electrical element of the electrical elements is disposed and exposed within the space.

In a preferred embodiment, the present invention further provides an assembling method of a USB application device, wherein the USB application device comprises a body and a circuit board, and the assembling method comprises:
 disposing a plurality of electrical elements and a plurality of first electrical pins on the circuit board, wherein a first end of each of the first electrical pins connects with the circuit board, and each of the first electrical pins passes over a first surface of the circuit board and extends to the body in suspension, so as to form a space between each of the first electrical pins and the circuit board; and
 disposing the circuit board within the body, and thus the plurality of first electrical pins are partly exposed by the body.

In a preferred embodiment, the first end of each of the first electrical pins disposed on the circuit board is mounted on the first surface of the circuit board by SMT or soldering technology.

In a preferred embodiment, the circuit board comprises a plurality of extending wire, each of the extending wires corresponds to one of the first electrical pins, in the step of disposing the plurality of electrical elements and the plurality of first electrical pins on the circuit board, the first end of each of the first electrical pins connects with the circuit board and is adjacent to a front end of the circuit board, each of the extending wire connects with the corresponding one of the first end and extends toward a rear end of the circuit board, and the extending wire is directly formed on the circuit board.

In a preferred embodiment, the first end of each of the first electrical pins is disposed on the circuit board by passing the first end through a circuit board aperture on the circuit board, so as to fix each of the first electrical pins on the circuit board.

In a preferred embodiment, the body comprises a body opening, the step of disposing the circuit board comprises inserting the circuit board to let a second end of the circuit board pass through the body opening and expose a first end of the circuit board outside the body opening, and thus the plurality of first electrical pins are partly exposed by the body.

In a preferred embodiment, the body comprises a bottom and a plurality of apertures, and the step of disposing the circuit board inside the body comprises:

inserting the circuit board into the bottom of the body, and thus a second end of the circuit board passing over the bottom and inserting into the body; and turning a first end of the circuit board over, and thus the first end of the circuit board passing over the bottom and located inside the body, and the plurality of first electrical pins partly exposed by the plurality of apertures, wherein each of the electrical pins corresponds to one of the apertures.

In a preferred embodiment, the body comprises a hook portion and the hook portion has an incline, and the step of turning the first end of the circuit board over comprises contacting the first end of the circuit board with the hook portion and turning the first end over along the incline of the hook portion, so as to locate the first end of the circuit board inside the body.

In a preferred embodiment, the assembling method of the present invention further comprises fitting a case onto the body after disposing the circuit board inside the body.

DETAILED DESCRIPTION OF THE PREFERRED EMBODIMENT

Figure 4:
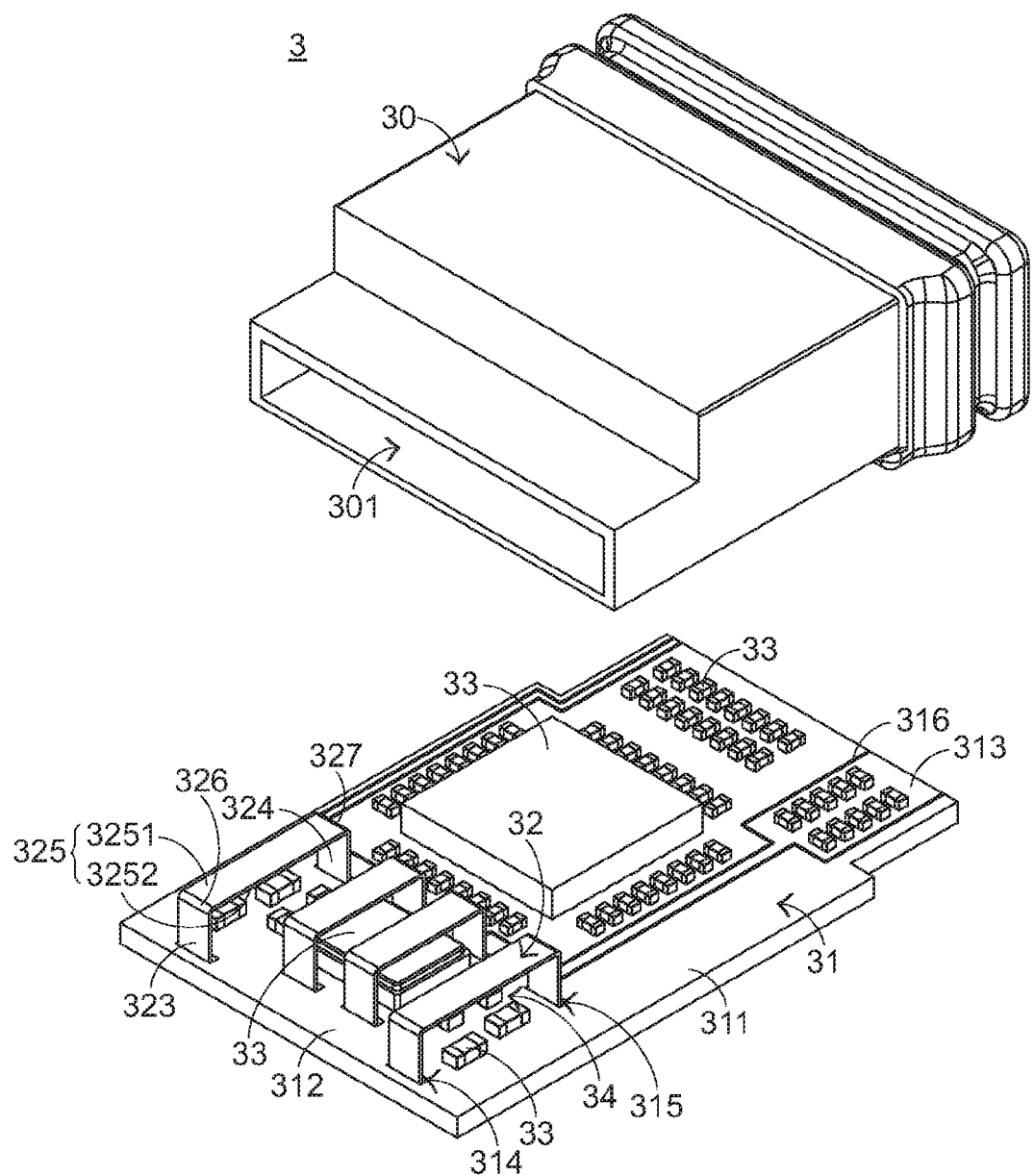
FIG. 4 illustrates a structural explosion view of a USB application device according to a first preferred embodiment of the present invention.

The present invention provides a USB application device. FIG. 4 illustrates a structural explosion view of a USB application device according to a first preferred embodiment of the present invention. Referring to FIG. 4, the USB application device 3 includes a body 30, a circuit board 31, a plurality of first electrical pins 32, and a plurality of electrical elements 33. The body 30 comprises a body opening 301, and the circuit board 31 comprises a plurality of circuit board apertures 314, a plurality of another circuit board apertures 315 and a plurality of extending wires 316. In addition, the plurality of circuit board apertures 314 and the plurality of another circuit board apertures 315 are adjacent to a first end 312 of the circuit board 31, and each of the circuit board apertures 314, each of the another circuit board apertures 315 and each of the extending wires 316 correspond to a first electrical pins 32. Each of the extending wires 316 is located on a first surface 311 of the circuit board 31 and correspondingly connects with each of the another circuit board apertures 315, and extends toward a second end 313 of the circuit board 31, wherein the plurality of extending wires 316 are directly formed on the first surface 311 of the circuit board 31. In the present preferred embodiment, the first surface 311 is an upper surface of the circuit board 31, the first end 312 is a front end of the circuit board 31, and the second end 313 is a rear end of the circuit board 31.

The plurality of electrical elements 33 are disposed to the first surface 311 of the circuit board 31, and a first end 321 of each of the first electrical pins 32 connects with the circuit board 31, passes over the first surface 311 of the circuit board 31, and extends toward the body 30 stereoscopically, i.e. extends toward a top of the circuit board 31. In addition, a second end 322 of each of the first electrical pins 32 connects with the circuit board 31 as well, and thus each of the first electrical pins 32 crosses over the plurality of electrical elements 33 on the circuit board 31, i.e. a space 34 is formed between each of the first electrical pins 32 and the circuit board 31. Accordingly, the plurality of electrical elements 33 are capable of being disposed within the space 34. In the present preferred embodiment, the first end 321 is a front end of the electrical pins 32, and the second end 322 is a rear end of the electrical pins 32.

Figure 5:
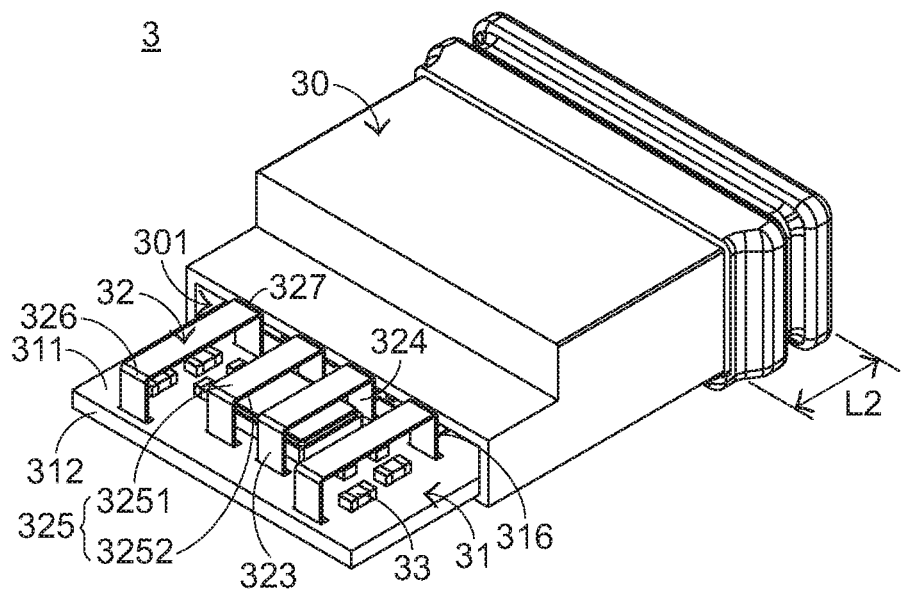
FIG. 5 illustrates an external structural view of a USB application device according to a first preferred embodiment of the present invention.
Figure 6:
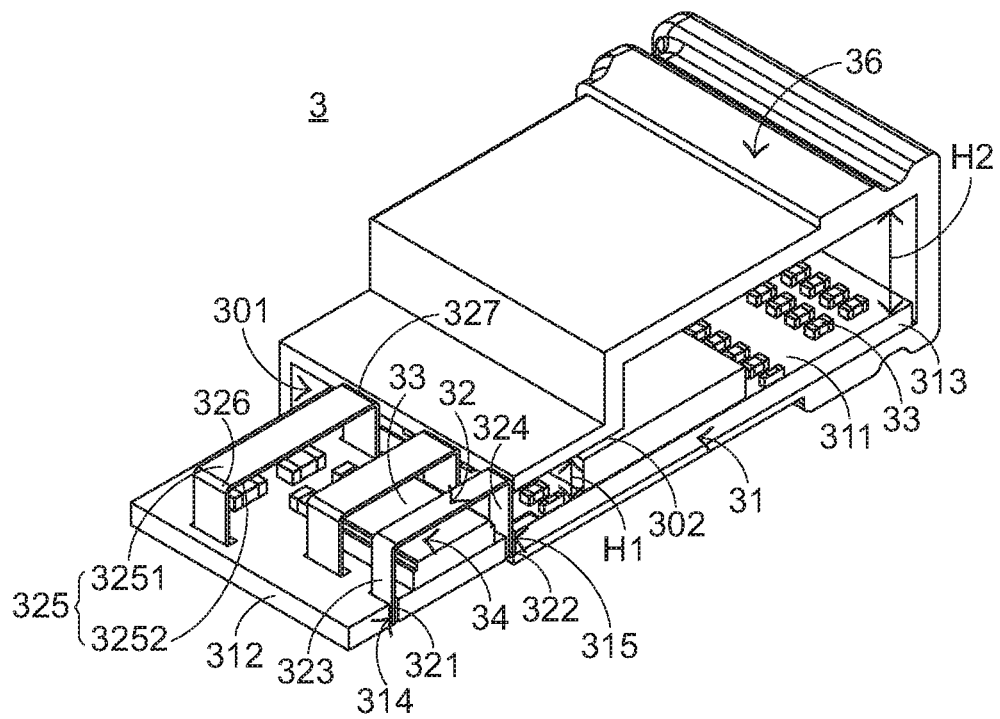
FIG. 6 illustrates a structural cross-sectional view of a USB application device according to a first preferred embodiment of the present invention.

The combination of all of the above mentioned elements is illustrated in FIG. 5 and FIG. 6, wherein FIG. 5 illustrates an external structural view of a USB application device according to a first preferred embodiment of the present invention, and FIG. 6 illustrates a structural cross-sectional view of a USB application device according to a first preferred embodiment of the present invention. Referring to FIG. 5 and FIG. 6 together, the circuit board 31 is disposed within the body 30, the first end 312 of the circuit board 31 is exposed by the body opening 301, and the second end of the circuit board 313 passes through the body opening 301 and inserts into the body 30. In addition, an opening height H1 of the body opening 301 is smaller than a body height H2 of the body 30, i.e. there is still some space inside the body 30 remaining for disposing the electrical elements 33 or other structures. For the first electrical pins 32, the first end 321 of each of the electrical pins 32 passes through the corresponding one of the circuit board apertures 314 to connect with the circuit board 31, and passes over the first surface 311 of the circuit board 31 to extend toward an inner surface 302 of the body 30. In addition, the second end 322 of each of the electrical pins 32 also passes through the corresponding one of the another circuit board apertures 315 to connect with the circuit board 31. Herein, each of the first electrical pins 32 connects with each of the extending wire 316 via each of the another circuit board apertures 315.

Figure 1:
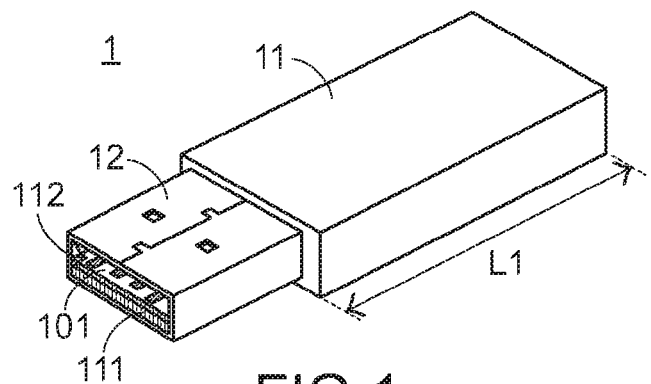
FIG. 1 illustrates an external structural view of a conventional receiver.
Figure 2:
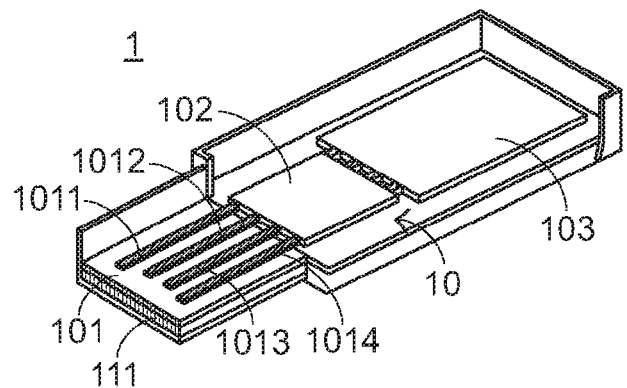
FIG. 2 illustrates an internal structural view of a conventional receiver.
Figure 3:
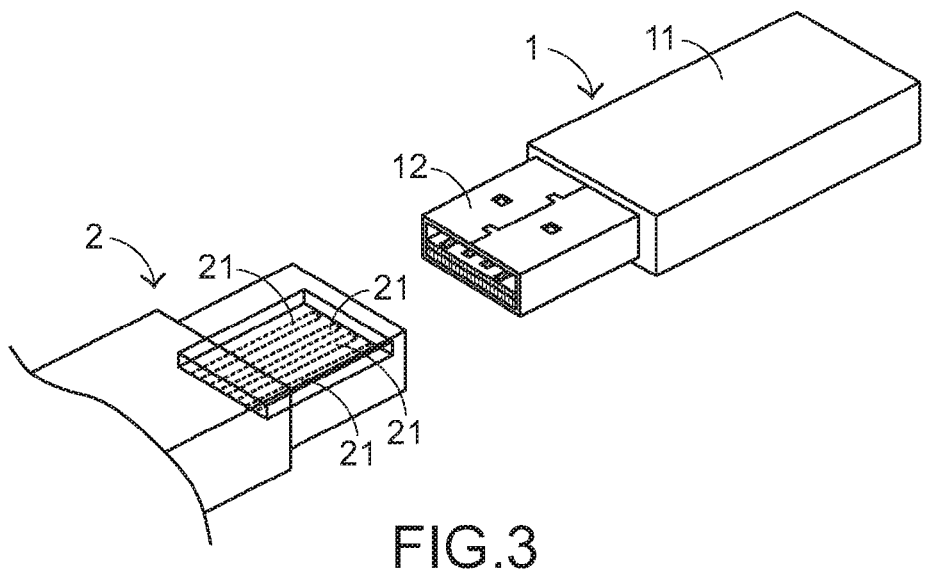
FIG. 3 illustrates a structural view of a connecting socket of a conventional receiver.

In the present preferred embodiment, each of the first electrical pins 32 is defined as a first fixing segment 321 (i.e. the first end thereof), a second fixing segment 322 (i.e. the second end thereof), a first extending segment 323, a second extending segment 324 and a contacting segment 325. In addition, the first fixing segment 321 and the second fixing segment 322 respectively pass through the corresponding one of the circuit board apertures 313 and the another circuit board apertures 314 to connect with the circuit board 31, and are adjacent to the first end 312 of the circuit board 31. Furthermore, the first extending segment 323 and the second extending segment 324 are located between the first surface 311 of the circuit board 31 and the body 30. Moreover, the contacting segment 325 is formed by stereoscopically extension and a first surface 3251 of the contacting segment 325 is exposed by the body 30, and thus the first surface 3251 of the contacting segment 325 is capable of contacting with the connecting pin 21 of the female connecting socket 2 (as illustrated in FIG. 3). Herein, a bending structure 326 is formed between the first extending segment 323 and the contacting segment 325, and another bending structure 327 is formed between the second extending segment 324 and the contacting segment 325. In addition, the bending structure 326 and the another bending structure 327 connect with the contacting segment 325 with an angle close to perpendicular or equal to perpendicular. Furthermore, at least one electrical element 33 of the plurality of electrical elements 33 is exposed within the space 34 formed between a second surface 3252 of the contacting segment 325 and the first surface 311 of the circuit board 31 as illustrated in FIG. 6. In a word, the plurality of first electrical pins 32 form as a USB 2.0 transmission interface. In another word, the plurality of first electrical pins 32 may be used as a male plug contacting portion, and the plurality of connecting pins 21 of the female connecting socket 2 used for connecting with the plurality of first electrical pins 32 form as a USB 2.0 transmission interface as well, and thus it is able to transmit data there-between.

Figure 7:
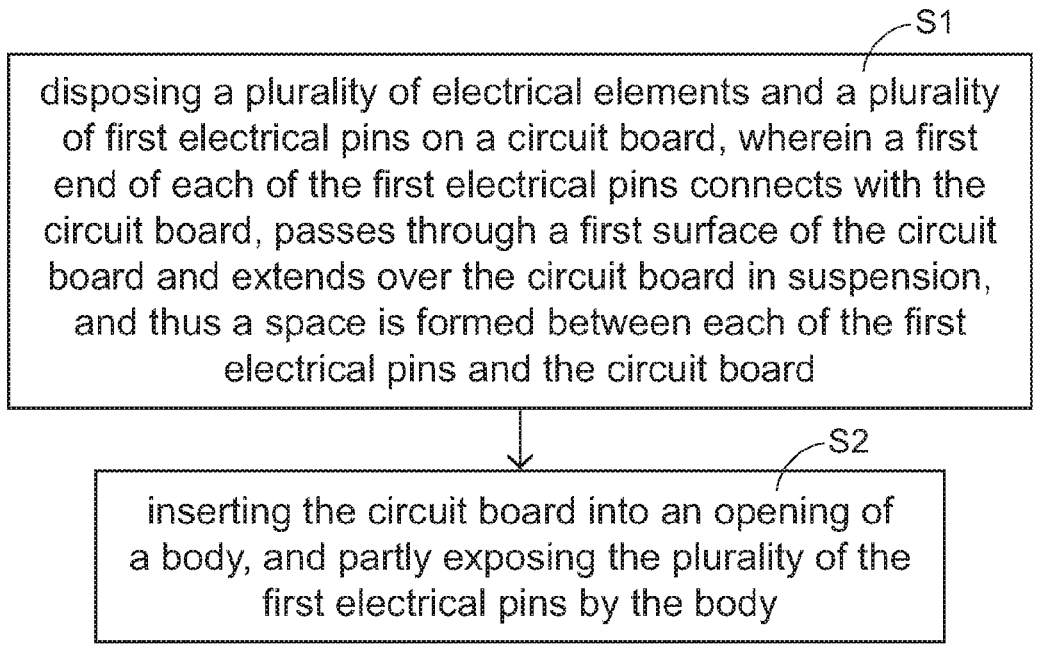
FIG. 7 illustrates a block diagram of an assembling method of a USB application device according to a first preferred embodiment of the present invention.
Figure 8A:
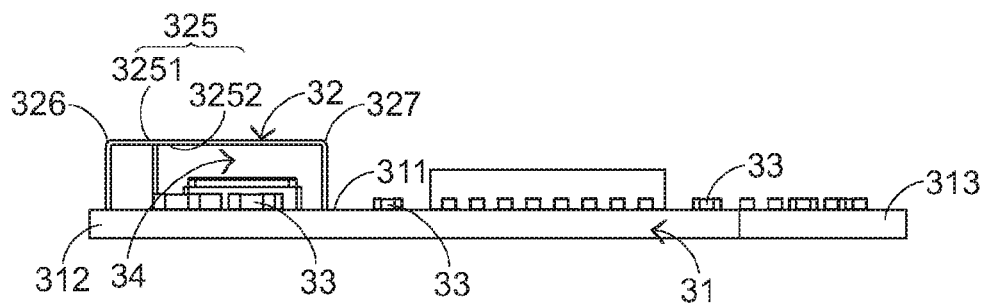
FIG. 8A to FIG. 8B illustrate a structural side view of assembling a USB application device according to a first preferred embodiment of the present invention.
Figure 8B:
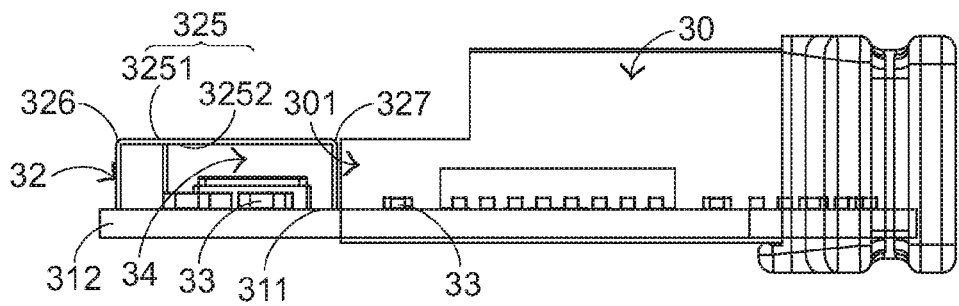

FIG. 7 illustrates a block diagram of an assembling method of a USB application device according to a first preferred embodiment of the present invention, and FIG. 8A to FIG. 8B illustrate a structural side view of assembling a USB application device according to a first preferred embodiment of the present invention. Next, referring to FIG. 7 first, the assembling method of the USB application device 3 comprises the following steps. The step S1 is disposing the plurality of electrical elements 33 and the plurality of first electrical pins 32 on the circuit board 31. Herein, the first end 321 of each of the first electrical pins 32 connects with the circuit board 31, passes over the first surface 311 of the circuit board 31 and extends toward the top of the circuit board 31 in suspension, so as to form the space 34 between each of the first electrical pins 32 and the circuit board 31. In addition, the step S2 is inserting the circuit board 31 into the body opening 301 of the body 30, and thus the plurality of first electrical pins 32 are partly exposed by the body 30.

In the step S1, the first end 321 of each of the first electrical pins 32 passes through the corresponding one of the circuit board aperture 314 on the circuit board 31, and the second end 322 of each of the first electrical pins 32 passes through the corresponding one of the another circuit board aperture 315 on the circuit board 31, so as to fix each of the first electrical pins 32 on the circuit board 31. Since the second end 322 of each of the first electrical pins 32 passes through the corresponding one of the another circuit board aperture 315 to connect with the circuit board 31, each of the first electrical pins 32 may connect with each of the extending wires 316 via each of the another circuit board aperture 315. In addition, the plurality of electrical elements 33 are disposed within the space 34 formed between the plurality of first electrical pins 32 and the circuit board 31 as shown in FIG. 8A. In the step S2, the circuit board 31 is inserted into the body 30 via the body opening 301, the second end 313 of the circuit board 31 passes through the body opening 301, and the first end 312 of the circuit board 31 is exposed outside the body opening 301, and thus the plurality of first electrical pins 32 are partly exposed by the body 30 as shown in FIG. 8B.

There are three points to be specified. First, the plurality of first electrical pins 32 form as a stereoscopic structure by enhancing the heights of the plurality of first electrical pins 32 due to the first the first extending segment 323 and the second extending segment 324 are disposed to the plurality of first electrical pins 32. Hence, the space 34 is formed between the plurality of first electrical pins 32 and the circuit board 31, and the space 34 may use for disposing a plurality of electrical elements 33 or containing other structures. Therefore, the area of the first end 312 (i.e. the front end) of the circuit board 31 available for use may be increased, and thus the required area of the second end 313 (i.e. the rear end) of the circuit board 31 is reduced, such that the second end 313 of the circuit board 31 can be cut for reducing the length of the circuit board 31. Accordingly, the length of the holding portion of the USB application device 3 can be reduced, and the length thereof is L2 (as illustrated in FIG. 5), and thus the volume of the USB application device 3 can be reduced.

Second, as illustrated in FIG. 4, although the electrical interference is avoidable by separating the first electrical pins 32 and the electrical elements 33, the present invention does not intent to limit to separate the first electrical pins 32 and the electrical elements 33. In another word, the first electrical pins can also be designed to contact with the electrical elements according to some specific requirements. For example, the first electrical pins can be grounded by contacting the first electrical pins with the electrical elements when the first electrical pins must be grounded. Therefore, an adaptability of a circuit layout of the USB application device of the present invention is able to be enhanced by the structure of the first electrical pins. Third, in the present preferred embodiment, the plurality of extending wires 316 are exposed by the first surface 311 of the circuit board 31. In other preferred embodiments, however, the plurality of extending wires can be disposed within the circuit board, and the plurality of extending wires connect with the first electrical pins via the circuit board apertures or the another circuit board apertures. This arrangement of the plurality of extending wires disposed within the circuit board can further be applied to a multi-layer circuit board structure.

Figure 9:
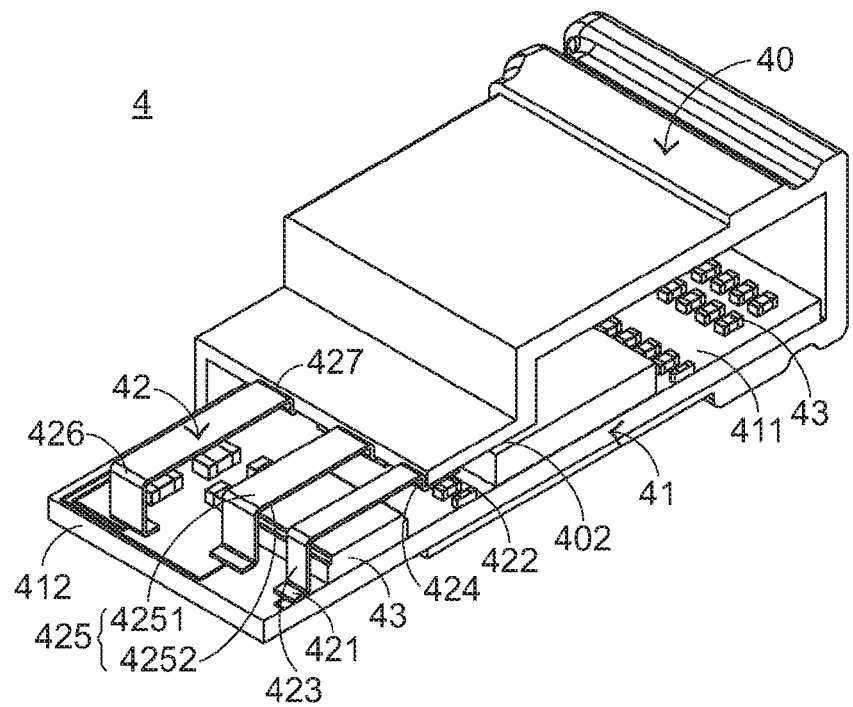
FIG. 9 illustrates a structural cross-sectional view of a USB application device according to a second preferred embodiment of the present invention.
Figure 10:
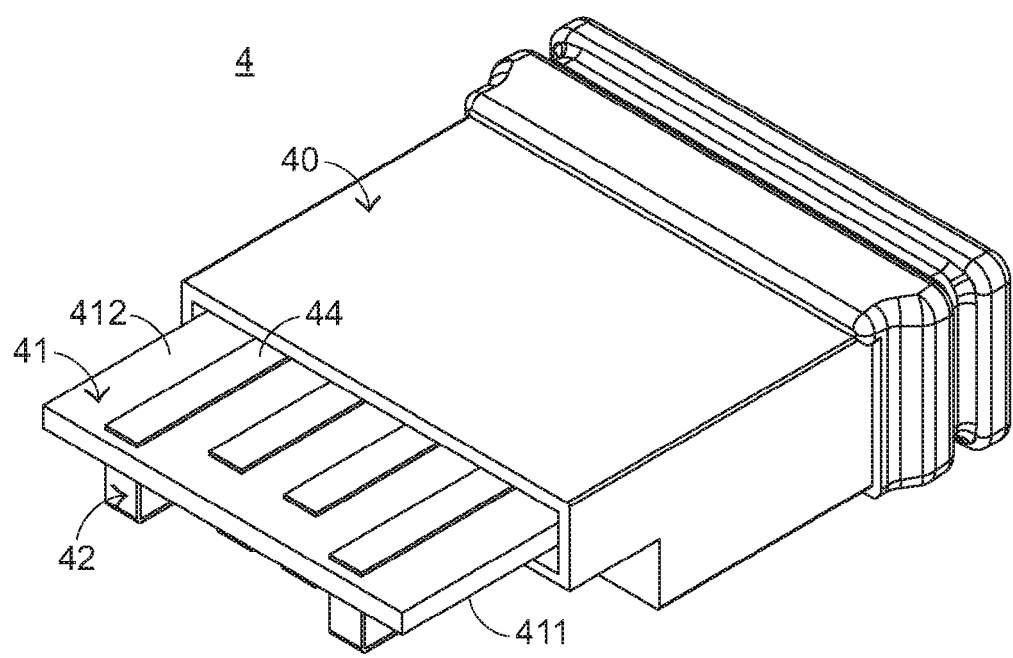
FIG. 10 illustrates an external structural view of a USB application device from another angle of view according to a second preferred embodiment of the present invention.

In addition, the present invention further provides a second preferred embodiment. FIG. 9 illustrates a structural cross-sectional view of a USB application device according to a second preferred embodiment of the present invention. FIG. 10 illustrates an external structural view of a USB application device from another angle of view according to a second preferred embodiment of the present invention. Referring to FIG. 9 and FIG. 10 together, the USB application device 4 comprises a body 40, a circuit board 41, a plurality of first electrical pins 42, a plurality of electrical elements 43 and a plurality of third electrical pins 44. The structure and the assembly method of the USB application device 4 of the present preferred embodiment are substantially the same as those of the USB application device 3 of the first preferred embodiment, but there are still two differences. First, each of the first electrical pins 42 of the USB application device 4 of the present preferred embodiment is defined as a first fixing segment 421 (i.e. the first end thereof), a second fixing segment 422 (i.e. the second end thereof), a first extending segment 423, a second extending segment 424 and a contacting segment 425. Herein, the first fixing segment 421 connects with the circuit board 41 by using a SMT process and is adjacent to the first end 413 of the circuit board 41, and the first extending segment 423 and the second extending segment 424 are located between the first surface 411 of the circuit board 41 and the body 40. In addition, a first surface 4251 of the contacting segment 425 is exposed by the body 40, and thus the first surface 4251 of the contacting segment 425 is capable of contacting with the connecting pins 21 of the female connecting socket 2 (as illustrated in FIG. 3). Further, a bending structure 426 is formed between the first extending segment 423 and the contacting segment 425, and another bending structure 427 is formed between the second extending segment 427 and the contacting segment 425, wherein the bending structure 426 and the another bending structure 427 connect with the contacting segment 425 with an angle close to perpendicular or equal to perpendicular. Also, the second fixing segment 422 contacts with an inner surface 402 of the body 40 and thus being supported by the body 40, but the second fixing segment 422 does not contact with the circuit board 41, i.e. each of the electrical pins 42 is fixed with a lap joint manner.

Second, the USB application device 4 of the present preferred embodiment further comprises a plurality of third electrical pins 44, wherein each of the third electrical pins 44 is disposed on a second surface 412 of the circuit board 41 for contacting with the plurality of connecting pins 21 of the female connecting socket 2 (as illustrated in FIG. 3). Hence, the plurality of third electrical pins 44 form as another USB 2.0 transmission interface, and thus either the plurality of first electrical pins 42 or the plurality of third electrical pins 44 are able to contact with the plurality of connecting pins 21 for transmitting data, i.e. both side of the USB application device 4 are able to be plugged in. However, other structures of the present preferred embodiment are substantially the same as those of the first preferred embodiment and thus are omitted herein.

Figure 11:
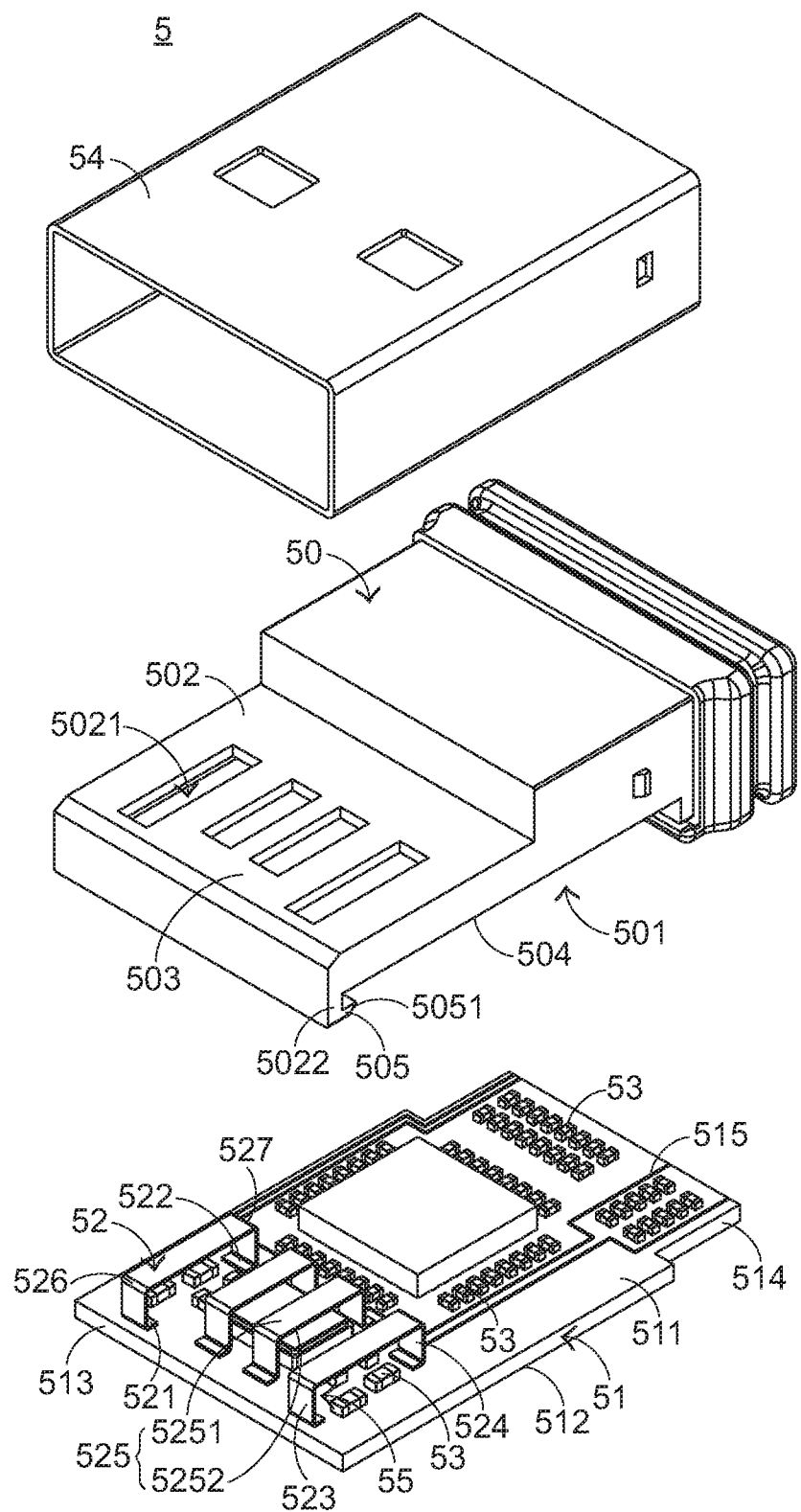
FIG. 11 illustrates a structural explosion view of a USB application device according to a third preferred embodiment of the present invention.

Besides, the present invention also provides a third preferred embodiment. FIG. 11 illustrates a structural explosion view of a USB application device according to a third preferred embodiment of the present invention. Referring to FIG. 11 hereinafter, the USB application device 5 comprises a body 50, a circuit board 51, a plurality of first electrical pins 52, a plurality of electrical elements 53 and a case 54. The body 50 comprises a body opening 501, a carrying portion 502 and a hook portion 505, wherein the body opening 501 is disposed on a bottom 504 of the body 50, and thus a second surface 512 of the circuit board 51 is exposed by the body opening 501. Moreover, the carrying portion 502 is formed by extending from the body 50 toward a front end 503 of the body 50, and the carrying portion 502 has a plurality of apertures 5021, wherein each of the apertures 5021 corresponds to one of the first electrical pins 52. Furthermore, the hook portion 505 is disposed to a front end 5022 of the hook portion 505 has an incline 5051. In addition, the circuit board 51 comprises a plurality of extending wires 515, and each of the extending wires 515 corresponds to one of the first electrical pins 52. Besides, each of the extending wires 515 is located on a first surface 511 of the circuit board 51 and extends toward a second end 514 of the circuit board 51, wherein the plurality of extending wires 515 are directly formed on the first surface 511 of the circuit board 51. In the present preferred embodiment, the first surface 511 is an upper surface of the circuit board 51, the second surface 512 is a lower surface of the circuit board 51, and the second end 514 is a rear end of the circuit board 51.

The plurality of the electrical elements 53 are disposed to the first surface 511 of the circuit board 51, and a first end 521 of each of the first electrical pins 52 connects with the circuit board 51, passes over the first surface 511 of the circuit board 51, and extends toward the body 50 stereoscopically, i.e. extends toward a top of the circuit board 51. In addition, a second end 522 of each of the first electrical pins 52 connects with the circuit board 51 as well, and thus each of the first electrical pins 52 crosses over the plurality of electrical elements 53 on the circuit board 51, i.e. a space 55 is formed between each of the first electrical pins 52 and the circuit board 51. Accordingly, the plurality of electrical elements 53 are capable of being disposed within the space 55. In the present preferred embodiment, the first end 521 of the electrical pins 52 is a front end of the electrical pins 52, and the second end 522 of the electrical pins 52 is a rear end of the electrical pins 52. Besides, the case 54 is capable of protecting the circuit board 51. In the present preferred embodiment, the case 54 is made of metal. However, in other preferred embodiment, the case may be made of plastic as well.

Figure 12:
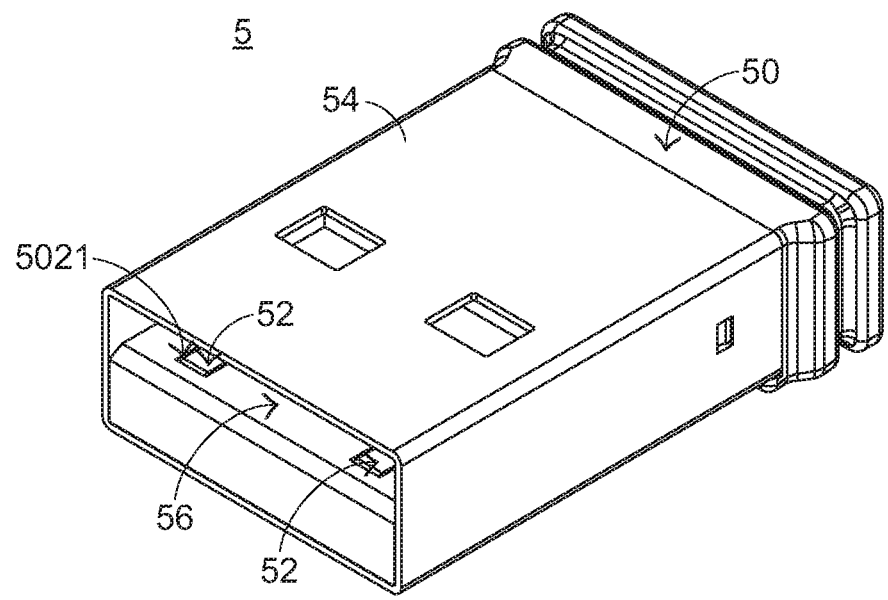
FIG. 12 illustrates an external structural view of a USB application device according to a third preferred embodiment of the present invention.
Figure 13:
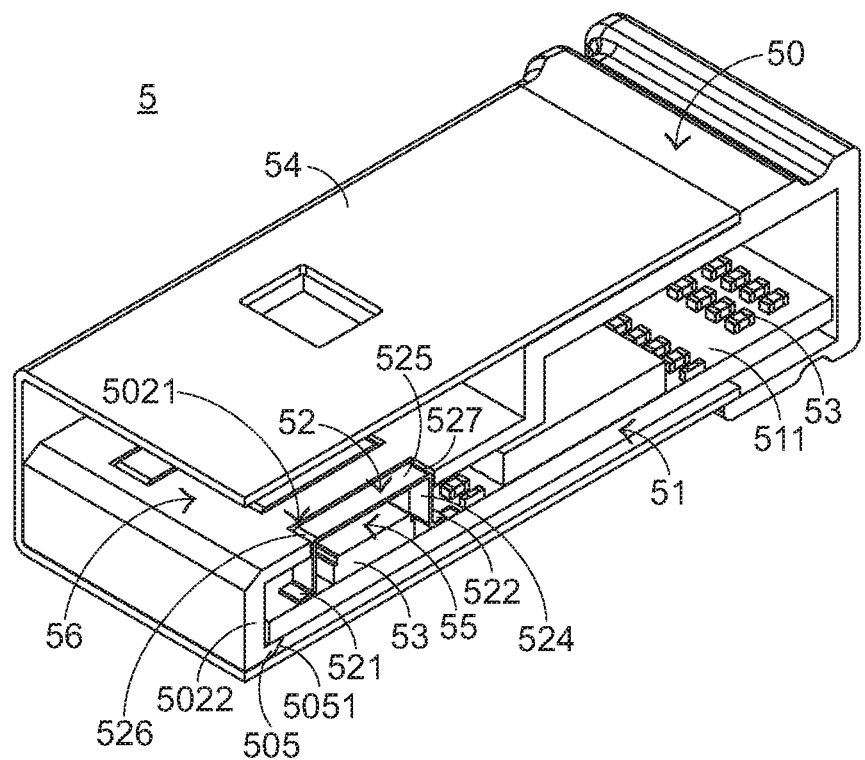
FIG. 13 illustrates a structural cross-sectional view of a USB application device according to a third preferred embodiment of the present invention.

The combination of all of the above mentioned elements is illustrated in FIG. 12 and FIG. 13, wherein FIG. 12 illustrates an external structural view of a USB application device according to a third preferred embodiment of the present invention, and FIG. 13 illustrates a structural cross-sectional view of a USB application device according to a third preferred embodiment of the present invention. Referring to FIG. 12 and FIG. 13 together, the circuit board 51 is disposed within the body 50, and each of the first electrical pins 52 is partly exposed by a corresponding one of the apertures 5021. The case 54 is fitting onto the body 50, so as to form an inserting space 56 between the case 54 and the body 50, wherein the inserting space 56 is used for letting the USB application device 5 fit into the female connecting socket 2 (as illustrated in FIG. 3) and letting the exposed portions of the plurality of electrical pins 52 contact with the plurality of connecting pins 21 of the female connecting socket 2 (as illustrated in FIG. 3).

For the first electrical pins 52, each of the first electrical pins 52 is also defined as a first fixing segment 521 (i.e. the first end thereof), a second fixing segment 522 (i.e. the second end thereof), a first extending segment 523, a second extending segment 524 and a contacting segment 525. As illustrated above, both of the first fixing segment 521 and the second fixing segment 522 connect with the circuit board 51 by using a SMT process and are adjacent to a first end 513 of the circuit board 51, wherein the first end 513 is a front end of the circuit board 51. Moreover, the first extending segment 523 and the second extending segment 524 are located between the first surface 511 of the circuit board 51 and the body 50, and a first surface 5251 of the contacting segment 525 is exposed by the corresponding one of the apertures 5021 of the body 50. Herein, a bending structure 526 is formed between the first extending segment 523 and the contacting segment 525, and another bending structure 527 is formed between the second extending segment 524 and the contacting segment 525, the bending structure 526 and the another bending structure 527 connect with the contacting segment 525 with an angle close to perpendicular or equal to perpendicular. Besides, at least one electrical element 53 of the plurality of electrical elements 53 is exposed within the space 55 formed between a second surface 5252 of the contacting segment 525 and the first surface 511 of the circuit board 51 as illustrated in FIG. 12. Similar to the first preferred embodiment, the plurality of first electrical pins 52 form as a USB 2.0 transmission interface as well.

In the present preferred embodiment, the first end 521 of each of the electrical pins 52 connects with the circuit board 51 by using a SMT process, passes over the first surface 511 of the circuit board 51 and extends toward the body 50, and the first end 521 of each of the first electrical pins 52 connects with the corresponding one of the extending wires 515. Besides, the second end 522 of each of the first electrical pins 52 also connects with the circuit board 51 by using a SMT process. However, in other preferred embodiments, at least one of the first end 521 and the second end 522 of each of the first electrical pins 52 may connect with the first surface 511 of the circuit board 51 by using a soldering technology.

In FIG. 13, the hook portion 505 of the body 50 is disposed to the front end 5022 of the carrying portion 502 for supporting the circuit board 51, so as to avoid the circuit board 51 protruding out of the bottom 504 of the body 50. In addition, the incline 5051 of the hook portion 505 is used for guiding the circuit board 51 inserting into the body 50 from the bottom 504 of the body 50.

Figure 14:
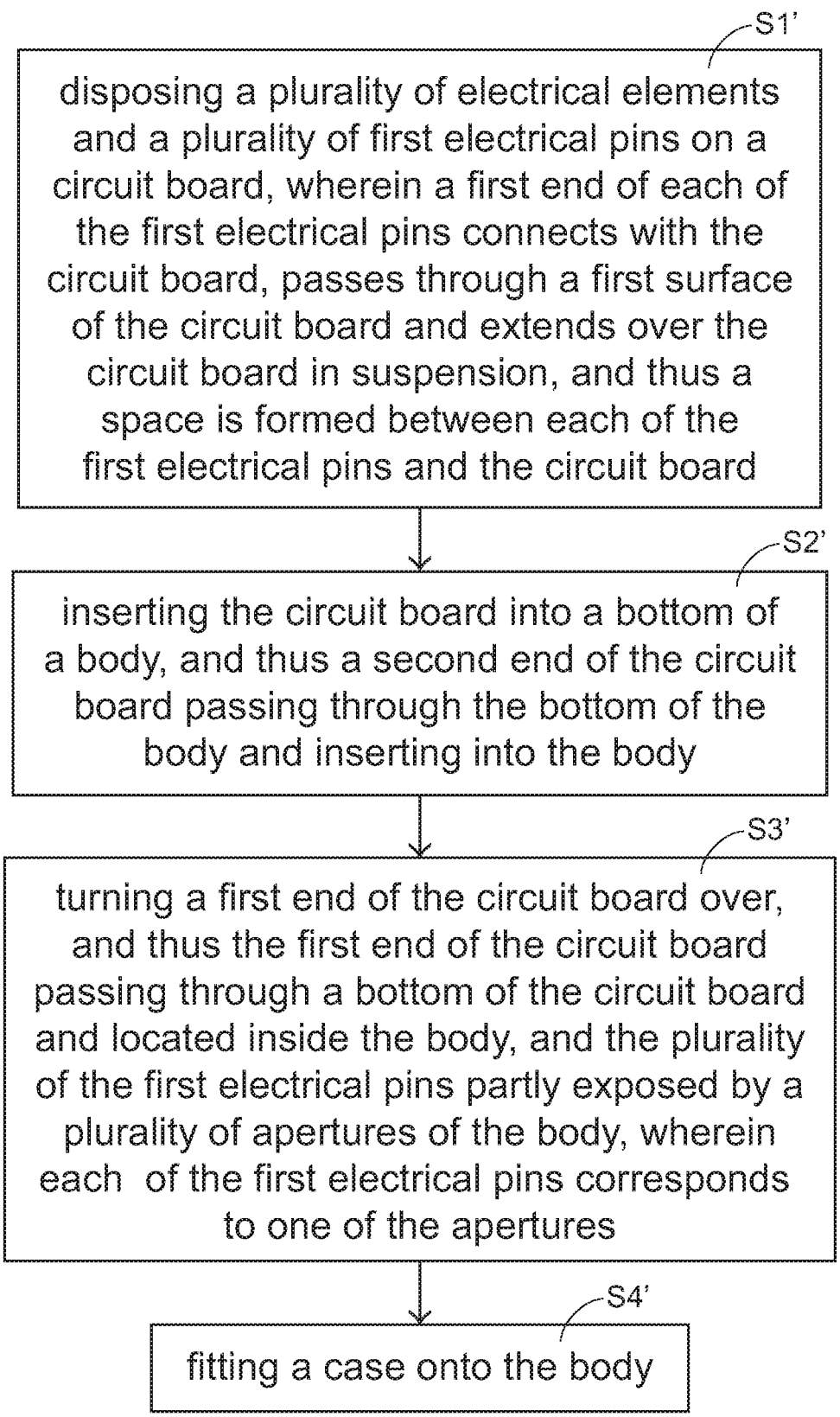
FIG. 14 illustrates a block diagram of an assembling method of a USB application device according to a third preferred embodiment of the present invention.
Figure 15A:
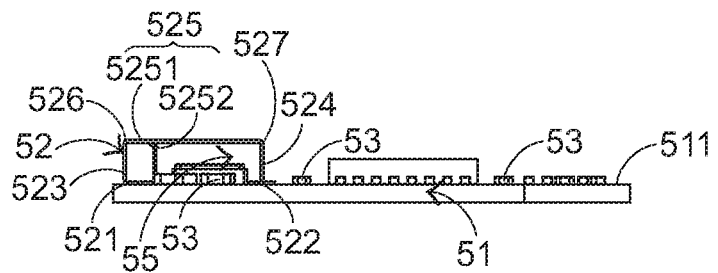
FIG. 15A to FIG. 15D illustrate a structural side view of assembling a USB application device according to a third preferred embodiment of the present invention.
Figure 15B:
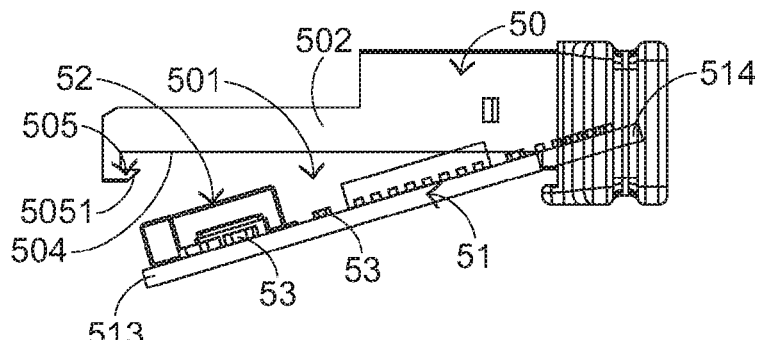
Figure 15C:
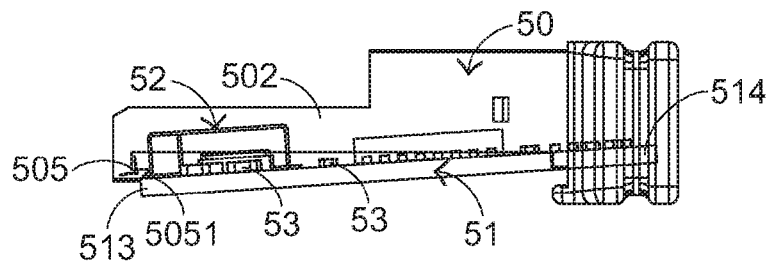
Figure 15D:
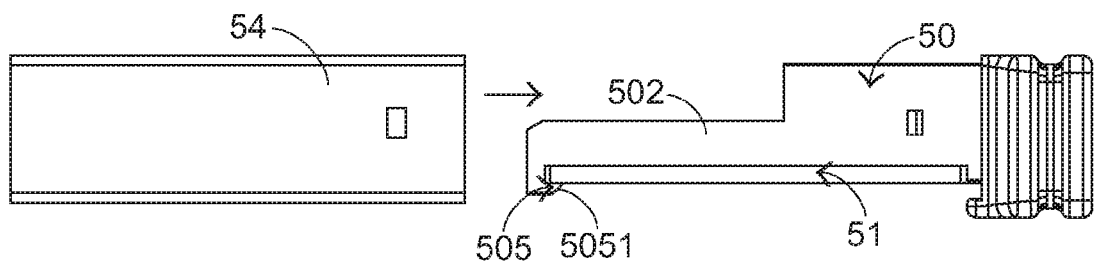

Referring to FIG. 14 and FIG. 15A to FIG. 15D together hereinafter, wherein FIG. 14 illustrates a block diagram of an assembling method of a USB application device according to a third preferred embodiment of the present invention, and FIG. 15A to FIG. 15D illustrate a structural side view of assembling a USB application device according to a third preferred embodiment of the present invention. The assembling method of the USB application device 5 comprises the following steps. The step S1' is disposing the plurality of electrical elements 53 and the plurality of first electrical pins 52 on the circuit board 51. Herein, the first end 521 of each of the first electrical pins 52 connects with the circuit board 51, passes over the first surface 511 of the circuit board 51 and extends toward the top of the circuit board 51 in suspension, so as to form the space 55 between each of the first electrical pins 52 and the circuit board 51 as illustrated in FIG. 15A. The step S2' is inserting the circuit board 51 into the bottom 504 of the body 50, and thus the second end 514 of the circuit board 51 passes through the bottom 504 of the body 50 and then inserts into the body 50 as illustrated in FIG. 15B. The step S3' is turning the first end 513 of the circuit board 51 over, and thus the first end 513 of the circuit board 51 passes over the bottom 504 of the body 50 and is located inside the body 50. In addition, the plurality of first electrical pins 52 are partly exposed by the plurality of apertures 5021 of the body 50, and each of the electrical pins 52 corresponds to one of the apertures 5021 as illustrated in FIG. 15C. Besides, the step S4' is fitting the case 54 onto the body 50 as illustrated in FIG. 15D.

In the step S3', the detail steps of turning over the first end 513 of the circuit board 51 is contacting the first end 513 of the circuit board 51 with the hook portion 505 first and then turning over the first end 513 of the circuit board 51 along the incline 5051 of the hook portion 505, so as to locate the first end 513 of the circuit board 51 inside the body 50. Therefore, the plurality of first electrical pins 52 are capable of being partly exposed by the plurality of apertures 5021 of the body 50.

There are three points to be specified. First, the body 50 of the USB application device 5 of the present invention has the carrying portion 502, and thus it is capable of further protecting the first electrical pins 52 and the circuit board 51 due to most of the first electrical pins 52 and the circuit board 51 are located inside the body 50. Second, for the USB application device 5 of the present invention, the case 54 can be decided whether to fit onto the body 50 or not according to various requirements. Third, the plurality of first electrical pins 52 of the present preferred embodiment don't need to be fixed or assembled on the body 50 or in the plurality of apertures 5021 in advance, but are fixed on the circuit board 51 instead.

Figure 16:
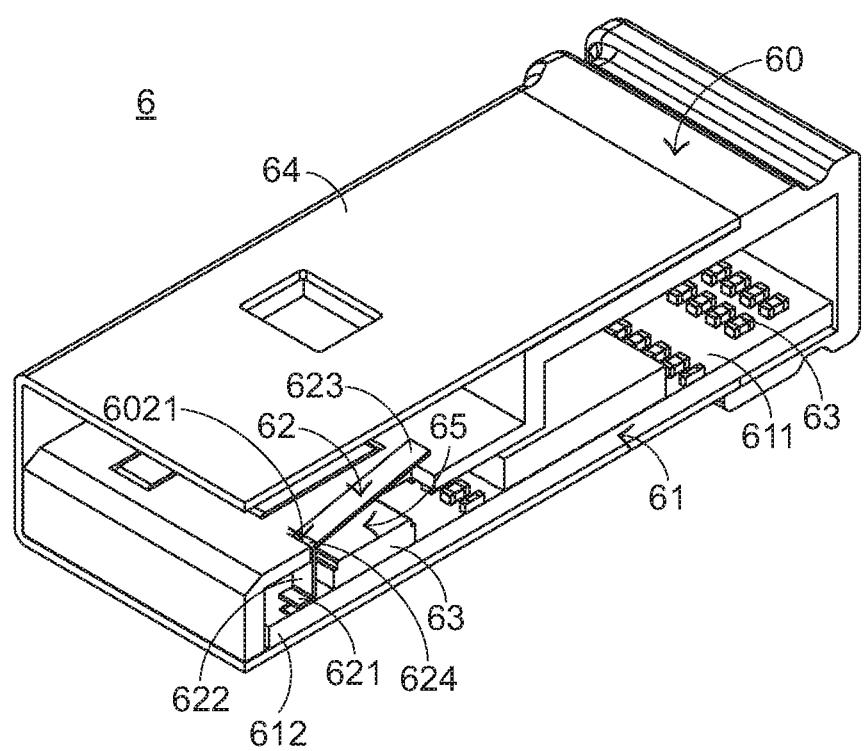
FIG. 16 illustrates a structural cross-sectional view of a USB application device according to a fourth preferred embodiment of the present invention.

Moreover, the present invention further provides a fourth preferred embodiment. FIG. 16 illustrates a structural cross-sectional view of a USB application device according to a fourth preferred embodiment of the present invention. Referring to FIG. 16, the USB application device 6 comprises a body 60, a circuit board 61, a plurality of first electrical pins 62, a plurality of electrical elements 63 and a case 64. The structure and the assembly method of the USB application device 6 of the present preferred embodiment are substantially the same as those of the USB application device 5 of the third preferred embodiment.

The present preferred embodiment is different from the third preferred embodiment in following portions. Each of the first electrical pins 62 of the USB application device 6 of the present preferred embodiment is defined as a fixing segment 621, a first extending segment 622 and a contacting segment 623. The fixing segment 621 is the first end of the first electrical pins 62, connects with the circuit board 61 by using a soldering technology, and is adjacent to a first end 612 of the circuit board 61. Further, the extending segment 622 are located between the first surface 611 of the circuit board 61 and the body 60, and a bending structure 624 is formed between the extending segment 622 and the contacting segment 623, wherein the bending structure 624 connects with the contacting segment 623 with an angle close to perpendicular or equal to perpendicular. The contacting segment 623 is the second end of the electrical pins 62, and the contacting segment 623 passes through the corresponding one of the apertures 6021 and thus is exposed by the body 60. Herein, the contacting segment 623 is separated from the body 60 and a space 65 is formed between a second surface 6232 of the contacting segment 623 and the first surface 611 of the circuit board 61. However, other structures of the present preferred embodiment are substantially the same as those of the third preferred embodiment and thus are omitted herein.

Figure 17:
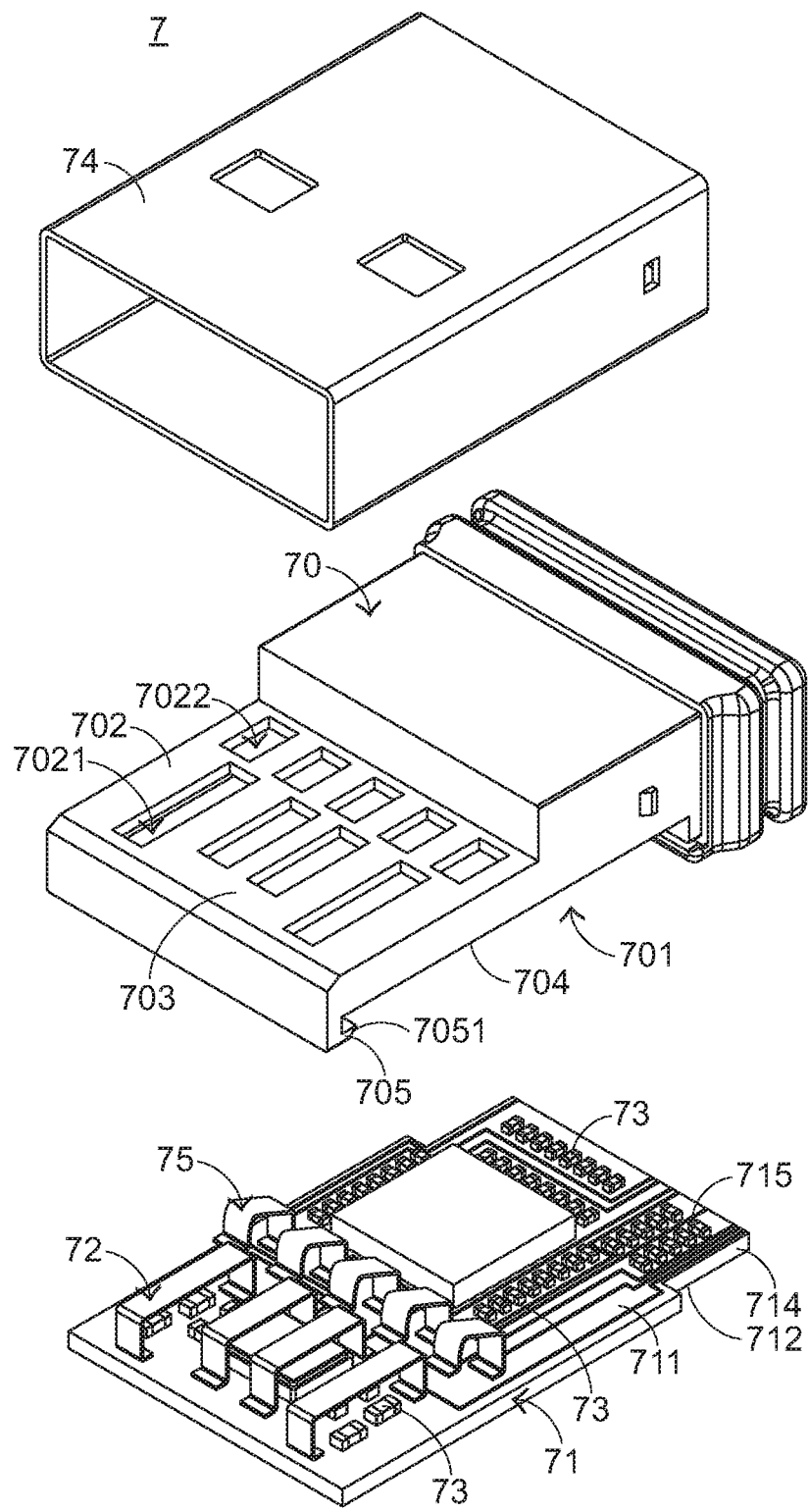
FIG. 17 illustrates a structural explosion view of a USB application device according to a fifth preferred embodiment of the present invention.

Furthermore, the present invention further provides a fifth preferred embodiment. FIG. 17 illustrates a structural explosion view of a USB application device according to a fifth preferred embodiment of the present invention. Referring to FIG. 17, the USB application device 7 comprises a body 70, a circuit board 71, a plurality of first electrical pins 72, a plurality of electrical elements 73, a case 64 and a plurality of second electrical pins 75. The body 70 comprises a body opening 701, a carrying portion 702 and a hook portion 705, wherein the body opening 701 is disposed on a bottom 704 of the body 70, and thus a second surface 712 of the circuit board 71 is exposed by the body opening 701. The carrying portion 702 is formed by extending from the body 70 to a front end 703 the body 70, and the carrying portion 702 has a plurality of apertures 7021 and a plurality of another apertures 7022. Furthermore, each of the apertures 7021 corresponds to a first electrical pins 72, and each of another apertures 7022 corresponds to a second electrical pins 75.

The circuit board 71 comprises a plurality of extending wires 715, and each of the extending wires 715 corresponds to one of the first electrical pins 72 or one of the second electrical pins 75. Furthermore, each of the extending wires 715 is located on a first surface 711 of the circuit board 71 and extends toward a second end 714 of the circuit board, wherein the plurality of extending wires 715 are directly formed on the first surface 711 of the circuit board 71. In the present preferred embodiment, the first surface 711 is an upper surface of the circuit board 71, the second surface 712 is a lower surface of the circuit board 71, and the second end 714 is a rear end of the circuit board 71.

Figure 18:
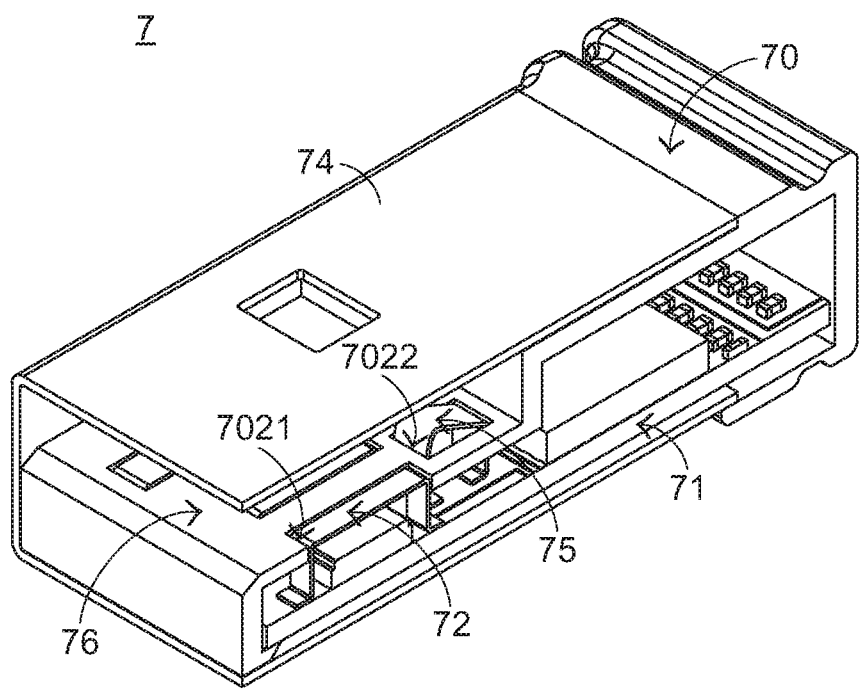
FIG. 18 illustrates a structural cross-sectional view of a USB application device according to a fifth preferred embodiment of the present invention.

The combination of all of the above mentioned elements is illustrated in FIG. 18, wherein FIG. 18 illustrates a structural cross-sectional view of a USB application device according to a fifth preferred embodiment of the present invention. Referring to FIG. 12 and FIG. 13 together, the circuit board 71 is disposed within the body 70, each of the first electrical pins 72 is partly exposed by a corresponding one of the apertures 7021, and each of the second electrical pins 75 is partly exposed by a corresponding one of the another apertures 7022. The case 74 is fitting onto the body 70, so as to form an inserting space 76 between the case 74 and the body 70, and the inserting space 76 is used for letting the USB application device 7 fit into the female connecting socket 2 (as illustrated in FIG. 3), wherein the plurality of first electrical pins 72 form as a USB 2.0 transmission interface, and the plurality of first electrical pins 72 and the plurality of second electrical pins 75 form as a USB 3.0 transmission interface together. However, other structures of the present preferred embodiment are substantially the same as those of the third preferred embodiment and thus are omitted herein.

According to each of the above mentioned preferred embodiments, it is understood that the plurality of first electrical pins form as a stereoscopic structure due to the plurality of first electrical pins of the USB application device of the present invention are bent, and thus a space is formed between the circuit board and the plurality of first electrical pins for disposing the plurality of electrical elements therein or for other purpose. Therefore, in the USB application device of the present invention, the plurality of electrical elements originally disposed to the rear end of the circuit board can be moved to the space between the plurality of first electrical pins and the circuit board, and thus the rear end of the circuit board does not need to be used anymore and can be omitted. Accordingly, the length of the conventional circuit board can be reduced, and thus the volume of the receiver can be further reduced. Moreover, the assembling method of the USB application device of the present invention is disposing the electrical elements and the first electrical pins on the circuit board first, and then assembling the circuit board and the body. The advantage of the assembling method is that the process for disposing the electrical elements and the first electrical pins on the circuit board is much easier, and thus the manufacturers can assemble the USB application device accurately by using an apparatus with lower cost. Hence, the assembling method of the USB application device of the present invention can be reduced. Certainly, the USB application device of the present invention can be used for various fields comprising storage or memory devices (such as flash devices, MP3 players), USB connecting plugs formed by combining with wires, and various receivers, wherein the various receivers comprise wireless mouse receivers, wireless keyboard receivers, Wi-Fi wireless network receivers and so on.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A USB application device capable of fitting into a female connecting socket, wherein the female connecting socket comprises a plurality of connecting pins, and the USB application device comprises:
    a body;
    a circuit board, disposed within the body;
    a plurality of first electrical pins, a first end of each of the first electrical pins connecting with the circuit board, passing over a first surface of the circuit board and stereoscopically extending toward a top of the body, and thus each of the first electrical pins partly exposed by the body and contacting with each of the connecting pins of the female connecting socket, wherein a space is formed between each of the first electrical pins and the circuit board and another space is formed between the circuit board and the body; and
    a plurality of electrical elements, disposed to the first surface of the circuit board;
    wherein each of the first electrical pins comprises a first fixing segment, a second fixing segment, a first extending segment, a second extending segment, and a contacting segment, the first fixing segment is the first end of each of the first electrical pins, the second fixing segment is a second end of each of the first electrical pins, the first extending segment and the second extending segment are located between the first surface of the circuit board and the body, a first surface of the contacting segment is exposed by the body, the first surface of the contacting segment is used for contacting with the connecting pins, a bending structure is formed between the first extending segment and the contacting segment, and another bending structure is formed between the second extending segment and the contacting segment.

2. The USB application device as claimed in claim 1, further comprising a case fitting onto the body, so as to form an inserting space between the case and the body.

3. The USB application device as claimed in claim 1, wherein at least an electrical element of the plurality of electrical elements is disposed within the space formed between each of the first electrical pins and the circuit board.

4. The USB application device as claimed in claim 1, wherein the body comprises a body opening, a first end of the circuit board is exposed by the body opening, a second end of the circuit board passes through the body opening and inserts into the body, and an opening height of the body opening is smaller than a body height of the body.

5. The USB application device as claimed in claim 1, wherein at least one of the first end and a second end of each of the first electrical pins is mounted on the first surface of the circuit board by surface mounted technology or soldering technology.

6. The USB application device as claimed in claim 1, wherein the circuit board comprises a plurality of circuit board apertures, each of the circuit board apertures corresponds each of the first electrical pins, and at least one of the first end and a second end of each of the first electrical pins passes through the corresponding one of the circuit board apertures, so as to connect with the circuit board.

7. The USB application device as claimed in claim 1, wherein a second end of each of the first electrical pins contacts with an inner surface of the body.

8. The USB application device as claimed in claim 1, wherein the circuit board comprises a plurality of extending wires, each of the extending wires corresponds to one of the first electrical pins, both of each of the first fixing segments and each of the second fixing segments connect with the circuit board and are adjacent to a front end of the circuit board, each of the extending wires connects with at least one of the corresponding one of the first fixing segments and the corresponding one of the second fixing segments and extends toward a rear end of the circuit board, and the extending wire is directly formed on the circuit board.

9. The USB application device as claimed in claim 1, wherein at least an electrical element of the plurality of electrical elements is exposed within the space formed between a second surface of the contacting segment and the circuit board.

10. The USB application device as claimed in claim 1, further comprising a plurality of second electrical pins disposed on the first surface of the circuit board for contacting with a plurality of another connecting pins of the female connecting socket, wherein the plurality of first electrical pins form as a USB 2.0 transmission interface, while the plurality of first electrical pins and the plurality of second electrical pins form as a USB 3.0 transmission interface together.

11. The USB application device as claimed in claim 1, further comprising a plurality of third electrical pins disposed on a second surface of the circuit board for contacting with the plurality of connecting pins of the female connecting socket, wherein the plurality of third electrical pins form as another USB 2.0 transmission interface, and thus both side of the USB application device are able to be plugged in.

12. The USB application device as claimed in claim 1, wherein the body comprises:
 a body opening, disposed on a bottom of the body, and thus a second surface of the circuit board exposed by the body opening; and
 a carrying portion, formed by extending from the body toward a front end of the body, wherein the carrying portion has a plurality of apertures, each of the apertures corresponds to one of the first electrical pins, and each of the first electrical pins is partly exposed to each of the apertures.

13. The USB application device as claimed in claim 12, the body further comprising a hook portion disposed to a front end of the carrying portion for supporting the circuit board, and the hook portion having an incline for guiding the circuit board to insert into the body.

14. The USB application device as claimed in claim 1, wherein each of the first electrical pins comprises a fixing segment, an extending segment and a contacting segment, the fixing segment is the first end of each of the first electrical pins, the extending segment is located between the first surface of the circuit board and the body, a first surface of the contacting segment is exposed by the body, the first surface of the contacting segment is used for contacting with the connecting pins, and a bending structure is formed between the extending segment and the contacting segment.

15. The USB application device as claimed in claim 14, wherein the circuit board comprises a plurality of extending wire, and each of the extending wires corresponds to one of the first electrical pins, each of the fixing segments connects with the circuit board and is adjacent to a front end of the circuit board, each of the extending wires connects with the corresponding one of the fixing segments and extends toward a rear end of the circuit board, and the extending wire is directly formed on the circuit board.

16. The USB application device as claimed in claim 14, wherein at least an electrical element of the plurality of electrical elements is exposed within the space formed between a second surface of the contacting segment and the circuit board.

17. The USB application device as claimed in claim 14, wherein the contacting segment is a second end of the first electrical pins, and the contacting segment is exposed by the body without contacting with the body.

18. A USB application device, comprises:
 a body;
 a circuit board, disposed within the body; a plurality of first electrical pins, disposed to the circuit board and adjacent to a front end of the circuit board, and each of the first electrical pins has a contacting segment used as a male plug contacting portion and formed from stereoscopically extending, wherein a first surface of each of the contacting segment is exposed by the body, and a space is formed between a second surface of each of the contacting segment opposite to the first surface and a first surface of the circuit board and another space is formed between the circuit board and the body; and
 a plurality of electrical elements, disposed to the circuit board, wherein at least an electrical element of the electrical elements is disposed and exposed within the space;
 wherein each of the first electrical pins comprises a first fixing segment, a second fixing segment, a first extending segment, a second extending segment, and a contacting segment, the first fixing segment is the first end of each of the first electrical pins, the second fixing segment is a second end of each of the first electrical pins, the first extending segment and the second extending segment are located between the first surface of the circuit board and the body, a first surface of the contacting segment is exposed by the body, the first surface of the contacting segment is used for contacting with the connecting pins, a bending structure is formed between the first extending segment and the contacting segment, and another bending structure is formed between the second extending segment and the contacting segment.

19. An assembling method of a USB application device, wherein the USB application device comprises a body and a circuit board, and the assembling method comprises:
 disposing a plurality of electrical elements and a plurality of first electrical pins on the circuit board, wherein a first end of each of the first electrical pins connects with the circuit board, and each of the first electrical pins passes over a first surface of the circuit board and extends to the body in suspension, so as to form a space between each of the first electrical pins and the circuit board; and
 wherein each of the first electrical pins comprises a first fixing segment, a second fixing segment, a first extending segment, a second extending segment, and a contacting segment, the first fixing segment is the first end of each of the first electrical pins, the second fixing segment is a second end of each of the first electrical pins, the first surface of the contacting segment is used for contacting with the connecting pins, a bending structure is formed between the first extending segment and the contacting segment, and another bending structure is formed between the second extending segment and the contacting segment;

disposing the circuit board within the body, so as to form a space between the circuit board and the body, the first extending segment and the second extending segment are located between the first surface of the circuit board and the body, a first surface of the contacting segment is exposed by the body, and thus the plurality of first electrical pins are partly exposed by the body.

20. The assembling method of the USB application device as claimed in claim 19, wherein the first end of each of the first electrical pins is disposed on the circuit board by passing the first end through a circuit board aperture on the circuit board, so as to fix each of the first electrical pins on the circuit board.

21. The assembling method of the USB application device as claimed in claim 19, wherein the body comprises a body opening, the step of disposing the circuit board comprises inserting the circuit board to let a second end of the circuit board pass through the body opening and expose a first end of the circuit board outside the body opening, and thus the plurality of first electrical pins are partly exposed by the body.

22. The assembling method of the USB application device as claimed in claim 19, further comprising fitting a case onto the body after disposing the circuit board inside the body.

23. The assembling method of the USB application device as claimed in claim 19, wherein the first end of each of the first electrical pins disposed on the circuit board is mounted on the first surface of the circuit board by surface mounted technology or soldering technology.

24. The assembling method of the USB application device as claimed in claim 23, wherein the circuit board comprises a plurality of extending wire, each of the extending wires corresponds to one of the first electrical pins, in the step of disposing the plurality of electrical elements and the plurality of first electrical pins on the circuit board, the first end of each of the first electrical pins connects with the circuit board and is adjacent to a front end of the circuit board, each of the extending wire connects with the corresponding one of the first end and extends toward a rear end of the circuit board, and the extending wire is directly formed on the circuit board.

25. The assembling method of the USB application device as claimed in claim 19, wherein the body comprises a bottom and a plurality of apertures, and the step of disposing the circuit board inside the body comprises:

inserting the circuit board into the bottom of the body, and thus a second end of the circuit board passing over the bottom and inserting into the body; and turning a first end of the circuit board over, and thus the first end of the circuit board passing over the bottom and located inside the body, and the plurality of first electrical pins partly exposed by the plurality of apertures, wherein each of the electrical pins corresponds to one of the apertures.

26. The assembling method of the USB application device as claimed in claim 25, wherein the body comprises a hook portion and the hook portion has an incline, and the step of turning the first end of the circuit board over comprises contacting the first end of the circuit board with the hook portion and turning the first end over along the incline of the hook portion, so as to locate the first end of the circuit board inside the body.

* * * * *